US012787472B2

(12) United States Patent
Kuroha

(10) Patent No.: US 12,787,472 B2
(45) Date of Patent: Nov. 3, 2026

(54) SEMICONDUCTOR DEVICE AND METHOD OF MANUFACTURING THE SAME

(71) Applicant: AOI ELECTRONICS CO., LTD., Takamatsu (JP)

(72) Inventor: Atsushi Kuroha, Kagawa (JP)

(73) Assignee: AOI ELECTRONICS CO., LTD., Kagawa (JP)

( * ) Notice: Subject to any disclaimer, the term of this patent is extended or adjusted under 35 U.S.C. 154(b) by 459 days.

(21) Appl. No.: 18/554,743

(22) PCT Filed: Feb. 14, 2022

(86) PCT No.: PCT/JP2022/005699
§ 371 (c)(1),
(2) Date: Oct. 10, 2023

(87) PCT Pub. No.: WO2022/219909
PCT Pub. Date: Oct. 20, 2022

(65) Prior Publication Data

US 2024/0332445 A1 Oct. 3, 2024

(30) Foreign Application Priority Data

Apr. 16, 2021 (JP) ................................ 2021-069428

(51) Int. Cl.
*H10F 77/50* (2025.01)
*G01S 7/481* (2006.01)
(Continued)

(52) U.S. Cl.
CPC .......... *H10F 55/255* (2025.01); *G01S 7/4814* (2013.01); *G01S 7/4816* (2013.01);
(Continued)

(58) Field of Classification Search
CPC .. H10W 70/40–481; H10W 70/04–048; H10F 55/00–255
See application file for complete search history.

(56) References Cited

U.S. PATENT DOCUMENTS 6,620,176 B1 * 9/2003 Peterson ................ A61B 17/11 606/151
2005/0023450 A1 2/2005 Ito
(Continued)

FOREIGN PATENT DOCUMENTS

JP S54-76679 U 5/1979
JP H06-5905 A 1/1994
(Continued)

OTHER PUBLICATIONS

International Search Report mailed on Apr. 19, 2022, in connection with corresponding International Application No. PCT/JP2022/005699 (5 pp., including machine-generated English translation).

*Primary Examiner* — Matthew C Landau
*Assistant Examiner* — Nora T. Nix
(74) *Attorney, Agent, or Firm* — McCormick, Paulding & Huber PLLC

(57) ABSTRACT

The increase in manufacturing cost is suppressed and reliability of a semiconductor device is improved. A semiconductor device 1 includes a light emitting element 2, a light receiving element 3, and a die pad 20 made of a conductive material. The die pad 20 includes a first region 20A and a second region 20B having a thickness greater than that of the first region 20A. The light receiving element 3 is provided on an upper surface of the first region 20A so as to be electrically insulated from the die pad 20. The light emitting element 2 is provided on an upper surface of the second region 20B via a conductive adhesive layer 5 inside a thorough hole 4 of the light receiving element 3. A position of an upper surface of the light emitting element 2 and a
(Continued)

A-A CROSS SECTION position of an upper surface of the light receiving element 3 coincide within a range of 5 μm or less.

15 Claims, 11 Drawing Sheets

(51) Int. Cl.
*G01S 17/08* (2006.01)
*H10F 55/255* (2025.01)
*H10F 71/00* (2025.01)
*H10F 77/00* (2025.01)

(52) U.S. Cl.
CPC .............. *G01S 17/08* (2013.01); *H10F 71/00* (2025.01); *H10F 77/50* (2025.01); *H10F 77/933* (2025.01)

(56) References Cited

U.S. PATENT DOCUMENTS

| | | | | |
|---|---|---|---|---|
| 2005/0029633 A1* | 2/2005 | Yumura | .................. | H10F 55/25<br>257/E25.032 |
| 2018/0114875 A1 | 4/2018 | Ho et al. | | |
| 2019/0081196 A1 | 3/2019 | Ho et al. | | |

FOREIGN PATENT DOCUMENTS

| | | | | |
|---|---|---|---|---|
| JP | 2005142427 A | 6/2005 | | |
| JP | 2009043821 A | 2/2009 | | |
| JP | 6620176 B2 * | 12/2019 | ............. | H10F 55/00 |
| WO | 2019/146339 A1 | 8/2019 | | |

* cited by examiner

A-A CROSS SECTION

A-A CROSS SECTION

A-A CROSS SECTION

A-A CROSS SECTION

SEMICONDUCTOR DEVICE AND METHOD OF MANUFACTURING THE SAME

CROSS-REFERENCE TO RELATED APPLICATIONS

This application is a National Stage application of International Patent Application No. PCT/JP2022/005699, filed on Feb. 14, 2022, which claims priority to Japanese Patent Application No. 2021-069428, filed on Apr. 16, 2021, each of which is hereby incorporated by reference in its entirety.

TECHNICAL FIELD

The present invention relates to a semiconductor device and a method of manufacturing the same, in particular, a semiconductor device including a light emitting element and a light receiving element and a method of manufacturing the same.

BACKGROUND

In recent years, semiconductor devices such as photocouplers including a light emitting element that emits light by converting an electrical signal into light and a light receiving element that converts received light into an electrical signal have been developed. The light emitted from the light emitting element is reflected by an object to be measured and received by the light receiving element.

For example, Patent Document 1 discloses a photocoupler in which, in order to improve the light detection sensitivity, the height of the light emitting surface of the light emitting element and the height of the light receiving surface of the light receiving element are located substantially on the same plane, whereby the distance from the light emitting surface to the object to be measured and the distance from the object to be measured to the light receiving surface are made substantially equal to each other.

Also, in order to obtain such a structure, in FIG. 1 of Patent Document 1, the light emitting element and the light receiving element are fixed to the lead frame by putting the light emitting element inside the hole provided in the lead frame and fitting the lead frame into the concave portion provided in the light receiving element. Further, in FIG. 6 of Patent Document 1, the light emitting element and the light receiving element are not provided on the lead frame, and are insulated from each other by being covered with resin. Moreover, in FIG. 9 of Patent Document 1, the light emitting element and the light receiving element are provided on the lead frame having a constant thickness via an adhesive.

Patent Document 1: Japanese Patent No. 6620176

SUMMARY

Problems to be Solved by the Invention

In FIG. 1 of Patent Document 1, the concave portion is provided in the light receiving element. However, since the processing technique for realizing this structure is highly difficult and the number of manufacturing steps increases, there is a problem of the increase in manufacturing cost. Further, in FIG. 6 of Patent Document 1, the light emitting element and the light receiving element are mounted without using a die pad. However, there is a problem that it becomes difficult to ensure the mounting reliability especially as the size of the package increases. In addition, if the light emitting element and the light receiving element are simply arranged on the lead frame having a constant thickness as shown in FIG. 9 of Patent Document 1, there is the fear that the conductive adhesive comes into contact with the side or lower surface of the light receiving element, causing the light receiving element to be short-circuited with the light emitting device and the lead frame. Namely, there is the fear that the function and reliability of the semiconductor device may be deteriorated.

A main object of this application is to suppress the increase in manufacturing cost and improve the reliability of a semiconductor device. Other problems and novel features will become apparent from the description of this specification and the accompanying drawings.

Means for Solving the Problem

A semiconductor device according to one embodiment includes a light emitting element having a light emitting region, a light receiving element having a light receiving region, and a die pad made of a conductive material. The die pad includes a first region and a second region having a thickness greater than that of the first region and surrounded by the first region in plan view, a through hole penetrating the light receiving element is provided in the light receiving element, the light receiving element is provided on an upper surface of the first region so as to be electrically insulated from the die pad, the light emitting element is provided on an upper surface of the second region via a conductive first adhesive layer inside the through hole, and a position of an upper surface of the light emitting element and a position of an upper surface of the light receiving element coincide within a range of 5 μm or less.

A method of manufacturing a semiconductor device according to one embodiment includes (a) preparing a metal plate made of a conductive material, a light emitting element having a light emitting region, and a light receiving element having a light receiving element and provided with a through hole formed therein, (b) after the (a), selectively etching the metal plate, thereby forming a die pad including a first region and a second region having a thickness greater than that of the first region and surrounded by the first region in plan view, (c) after the (b), selectively etching the metal plate, thereby forming a plurality of lead terminals on an outer periphery of the die pad in plan view so as to be physically separated from the die pad, (d) after the (c), placing the light receiving element on an upper surface of the first region so as to be electrically insulated from the die pad, (e) after the (c), placing the light emitting element via a first adhesive layer on an upper surface of the second region so as to be located inside the through hole, and (f) after the (d) and the (e), electrically connecting the light receiving element and the plurality of lead terminals by first bonding wires and electrically connecting the light emitting element and the light receiving element by a second bonding wire. A position of an upper surface of the light emitting element and a position of an upper surface of the light receiving element coincide within a range of 5 μm or less.

A method of manufacturing a semiconductor device according to one embodiment includes (a) preparing a first metal plate made of a conductive material, a second metal plate made of a conductive material, a light emitting element having a light emitting region, and a light receiving element having a light receiving region and provided with a through hole provided therein, (b) after the (a), selectively etching the first metal plate, thereby forming a die pad including a first region and a second region having a thickness greater than that of the first region and surrounded by the first region in plan view and forming a plurality of first lead terminal members on an outer periphery of the die pad in plan view so as to be physically separated from the die pad, (c) after the (a), selectively etching the second metal plate, thereby forming a plurality of second lead terminal members, (d) after the (b) and the (c), mounting an upper surface of the light emitting element, an upper surface of the light receiving element, and upper surfaces of the second lead terminal members on a base material such that the light emitting element is located inside the through hole, (e) after the (d), attaching an upper surface of the second region to a lower surface of the light emitting element via a conductive first adhesive layer and attaching upper surfaces of the plurality of first lead terminal members to lower surfaces of the plurality of second lead terminal members via conductive third adhesive layers, respectively, such that the light receiving element and the first region are physically separated, (f) after the (e), providing a resin layer between the light receiving element and the die pad, the light emitting element, the first adhesive layer, the plurality of first lead terminal members, and the plurality of second lead terminal members so as to fill the through hole, (g) after the (f), removing the base material, and (h) after the (g), electrically connecting the light receiving element and the plurality of second lead terminal members by first bonding wires and electrically connecting the light emitting element and the light receiving element by a second bonding wire. A position of the upper surface of the light emitting element and a position of the upper surface of the light receiving element coincide within a range of 5 μm or less.

Effects of the Invention

According to one embodiment, it is possible to suppress the increase in manufacturing cost and improve the reliability of a semiconductor device.

BRIEF DESCRIPTIONS OF THE DRAWINGS

DETAILED DESCRIPTION

Figure 1:
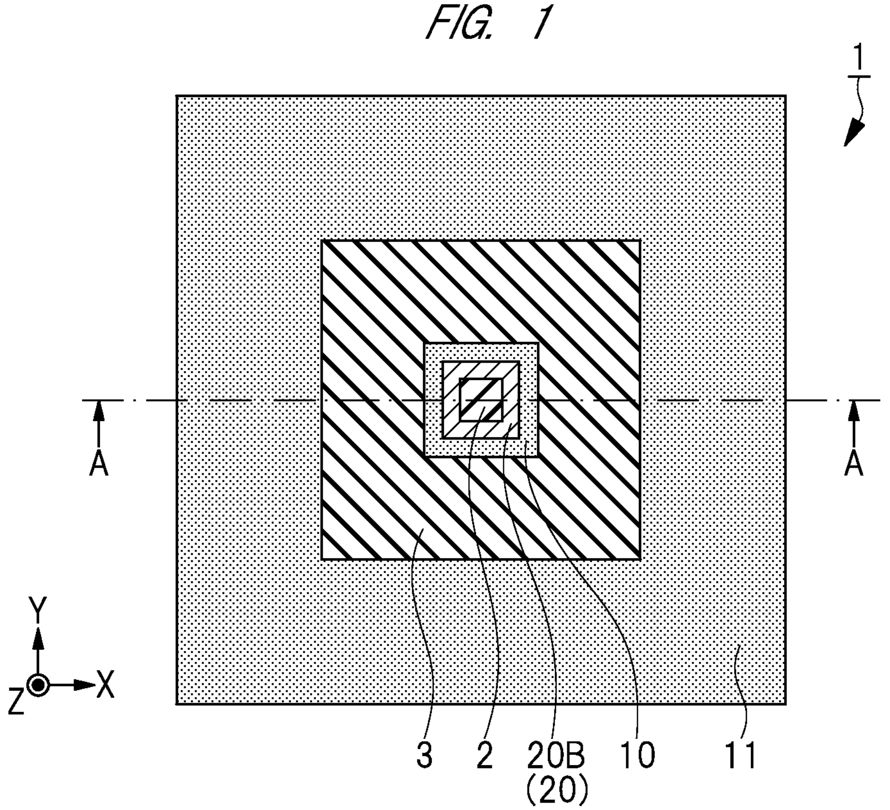
FIG. 1 is a plan view showing a semiconductor device according to the first embodiment.

Hereinafter, embodiments will be described in detail with reference to drawings. Note that the members having the same function are denoted by the same reference characters throughout the drawings for describing the embodiments, and the repetitive description thereof will be omitted. Further, in the following embodiments, the description of the same or similar part will not be repeated in principle unless particularly required.

Also, the X direction, the Y direction, and the Z direction in the description of this application cross each other and are orthogonal to each other. In the description of this application, the Z direction is defined as the longitudinal direction, the vertical direction, the height direction, or the thickness direction of a certain structure. Further, the expression "in plan view" used in this application means that a plane configured by the X direction and the Y direction is seen in the Z direction.

First Embodiment

<Configuration of Semiconductor Device>

Figure 2:
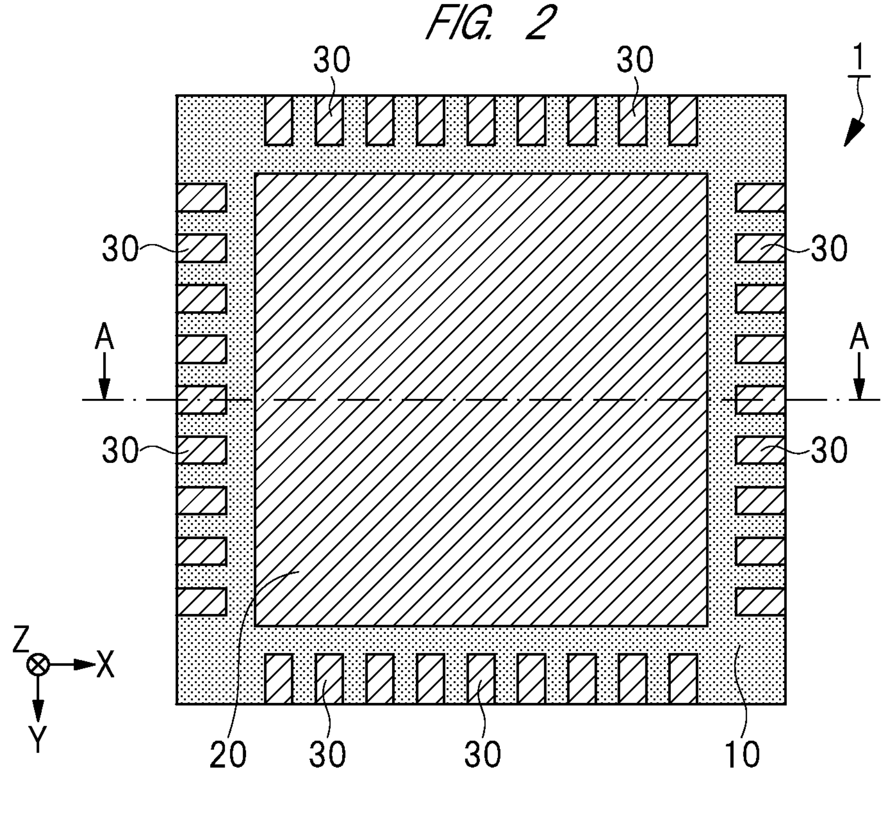
FIG. 2 is a bottom view showing the semiconductor device according to the first embodiment.
Figure 3:
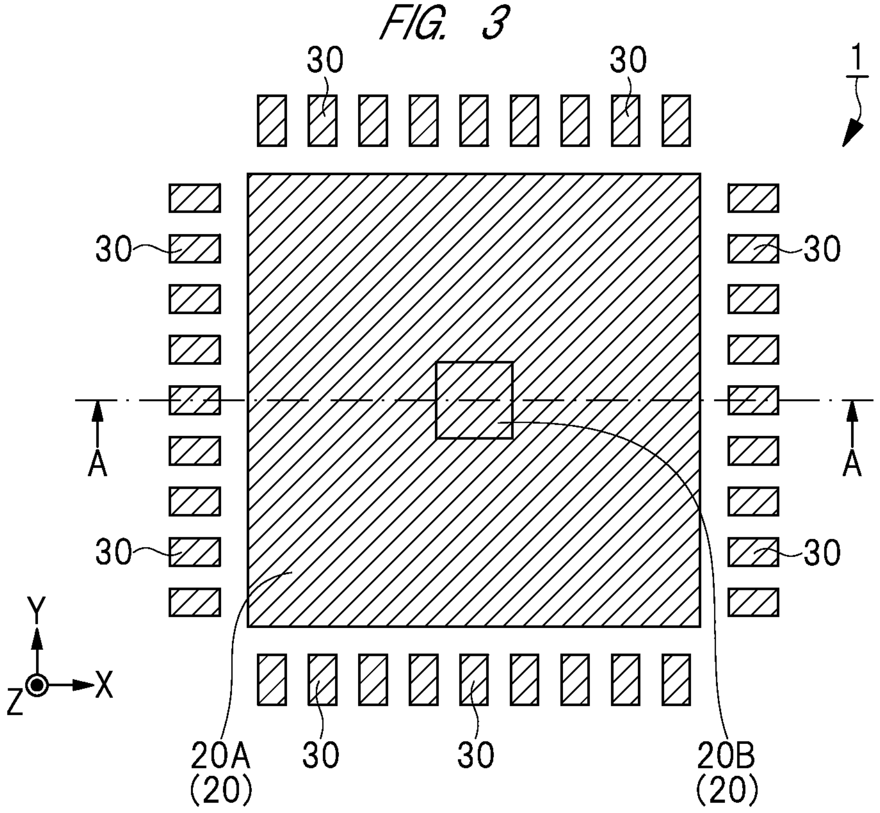
FIG. 3 is a plan view showing a die pad and a plurality of lead terminals according to the first embodiment.
Figure 4:
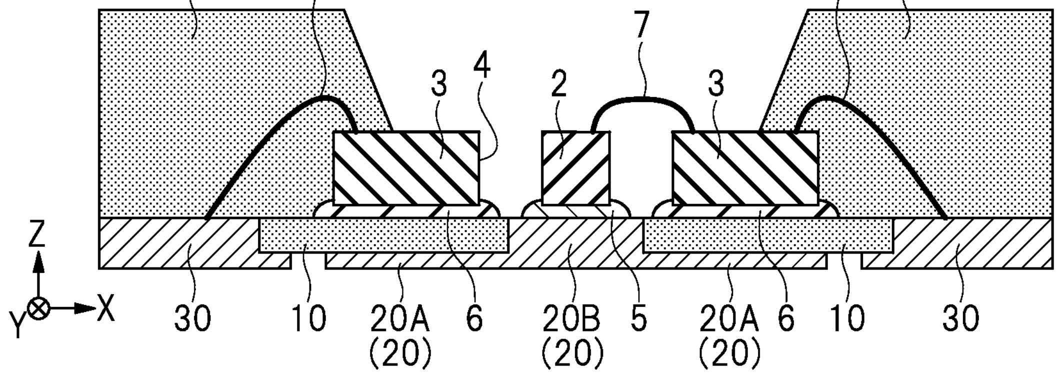
FIG. 4 is a cross-sectional view showing the semiconductor device according to the first embodiment.

A semiconductor device 1 according to the first embodiment will be described below with reference to FIG. 1 to FIG. 4. FIG. 1 is a plan view showing the semiconductor device 1, FIG. 2 is a bottom view showing the semiconductor device 1, and FIG. 3 is a plan view showing only a die pad 20 and a plurality of lead terminals 30 in the semiconductor device 1. FIG. 4 is a cross-sectional view taken along the line A-A shown in FIG. 1 to FIG. 3.

The semiconductor device 1 according to the first embodiment is, for example, a photocoupler suitable for an optical encoder. As shown in FIG. 1 to FIG. 3, the semiconductor device 1 includes a light emitting element 2, a light receiving element 3, a die pad 20, a plurality of lead terminals 30, and the like.

The light emitting element 2 has a light emitting region like a light emitting diode. The light receiving element 3 has a light receiving region like a photodiode and a plurality of transistors for driving the photodiode. The light emitted from the light emitting element 2 is reflected by an object to be measured (not shown), and the reflected light is received by the light receiving element 3. Here, an upper surface of the light emitting element 2 serves as the light emitting surface, and an upper surface of the light receiving element 3 serves as the light receiving surface.

The die pad 20 and the plurality of lead terminals 30 are made of a conductive material and can be formed by etching a single metal plate 50. The plurality of lead terminals 30 are provided on the outer periphery of the die pad 20 in plan view so as to be physically separated from the die pad 20.

As shown in FIG. 4, the die pad 20 includes a first region 20A and a second region 20B having a thickness greater than that of the first region 20A and surrounded by the first region 20A in plan view.

The light receiving element 3 is provided with a through hole 4 penetrating the light receiving element 3, and the light receiving element 3 is provided on an upper surface of the first region 20A so as to be electrically insulated from the die pad 20. In the first embodiment, a resin layer 10 is provided on the upper surface of the first region 20A, and the light receiving element 3 is provided on the upper surface of the first region 20A via the resin layer 10 and an insulating adhesive layer 6.

The position of an upper surface of the resin layer 10 is substantially the same as the position of an upper surface of the second region 20B. Namely, the upper surface of the resin layer 10 is flush with the upper surface of the second region 20B.

The light emitting element 2 is provided on the upper surface of the second region 20B via a conductive adhesive layer 5 inside the through hole 4. Namely, the light emitting element 2 is surrounded by the light receiving element 3 in plan view. Also, the cathode side of the light emitting region of the light emitting element 2 is electrically connected to the die pad 20 via the conductive adhesive layer 5.

Also, the light emitting element 2 and the light receiving element 3 are electrically connected by a bonding wire 7. Namely, the anode side of the light emitting region of the light emitting element 2 is electrically connected to the light receiving element 3 via the bonding wire 7. Also, the light receiving element 3 and the plurality of lead terminals 30 are electrically connected by the bonding wires 7.

<Method of Manufacturing Semiconductor Device>

A method of manufacturing the semiconductor device 1 according to the first embodiment will be described below with reference to FIG. 5 to FIG. 10. Note that FIG. 5 to FIG. 10 are cross-sectional views taken along the line A-A like FIG. 4.

First, the metal plate 50 made of a conductive material, the light emitting element 2, and the light receiving element 3 are prepared. The metal plate 50 is made of, for example, copper or a copper alloy in which tin, zirconium, iron, or the like is added to copper.

Figure 5:
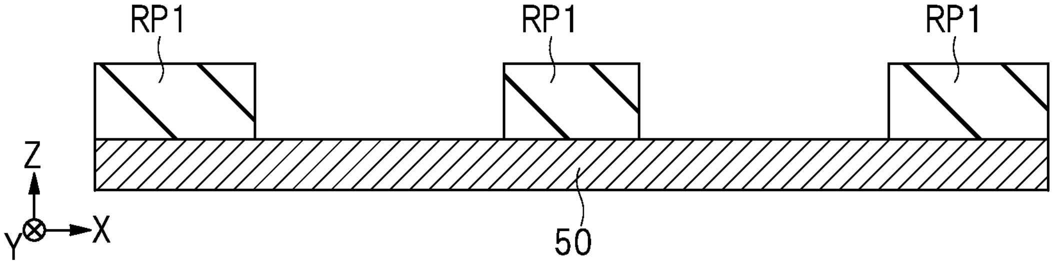
FIG. 5 is a cross-sectional view showing a method of manufacturing the semiconductor device according to the first embodiment.
Figure 6:
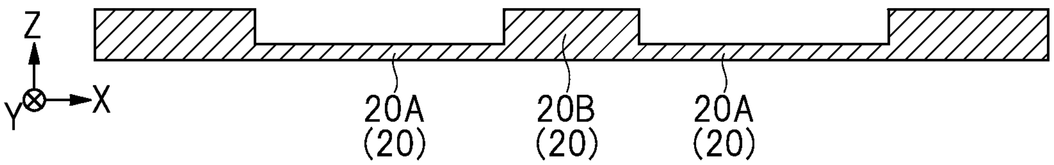
FIG. 6 is a cross-sectional view showing the method of manufacturing the semiconductor device subsequent to FIG. 5.

Next, as shown in FIG. 5, a resist pattern RP1 is formed on an upper surface of the metal plate 50. Next, as shown in FIG. 6, the metal plate 50 is processed such that the metal plate 50 is partially thinned by selectively etching the metal plate 50 with the resist pattern RP1 used as a mask. As a result, the die pad 20 including the relatively thin first region 20A and the relatively thick second region 20B is formed. Thereafter, the resist pattern RP1 is removed. Also, the height from the position of the upper surface of the first region 20A to the position of the upper surface of the second region 20B is in the range of, for example, 60% or more and 80% or less of the thickness of the metal plate 50 (thickness of the second region 20B).

Figure 7:
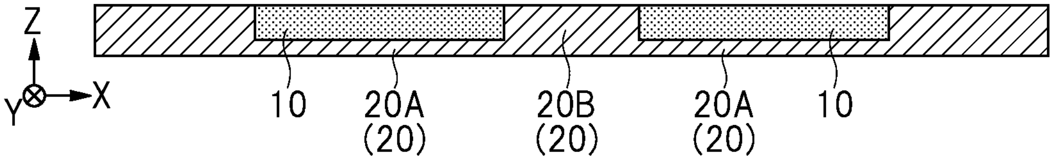
FIG. 7 is a cross-sectional view showing the method of manufacturing the semiconductor device subsequent to FIG. 6.

Next, as shown in FIG. 7, the resin layer 10 is provided on the upper surface of the first region 20A. The resin layer 10 is provided so as to fill the step between the first region 20A and the second region 20B, and is provided such that the upper surface of the resin layer 10 is flush with the upper surface of the second region 20B. Alternatively, the resin layer 10 to fill the step between the first region 20A and the second region 20B may be formed by forming a resin layer over the step between the first region 20A and the second region 20B and then grinding the upper surface of the metal plate 50 to remove unnecessary resin. Note that the resin layer 10 is made of an insulating resin, for example, an epoxy resin.

Figure 8:
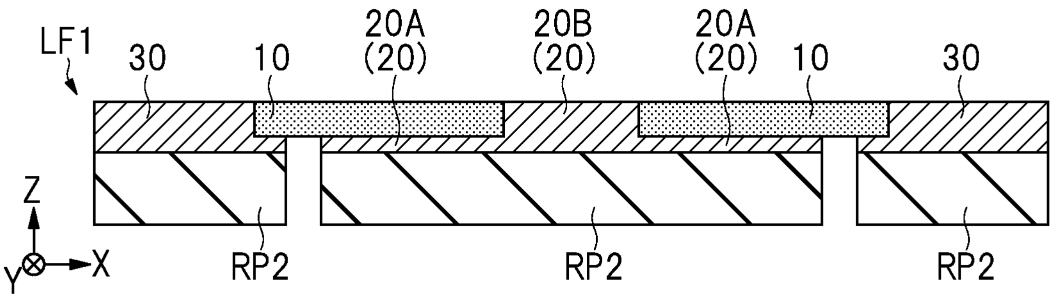
FIG. 8 is a cross-sectional view showing the method of manufacturing the semiconductor device subsequent to FIG. 7.

Next, as shown in FIG. 8, a resist pattern RP2 is formed on a lower surface of the metal plate 50. Next, the metal plate 50 is processed such that a part of the metal plate 50 is cut by selectively etching the metal plate 50 with the resist pattern RP2 used as a mask. As a result, a lead frame LF1 in which the plurality of lead terminals 30 are arranged on the outer periphery of the die pad 20 in plan view so as to be physically separated from the die pad 20 is formed. Thereafter, the resist pattern RP2 is removed.

Figure 9:
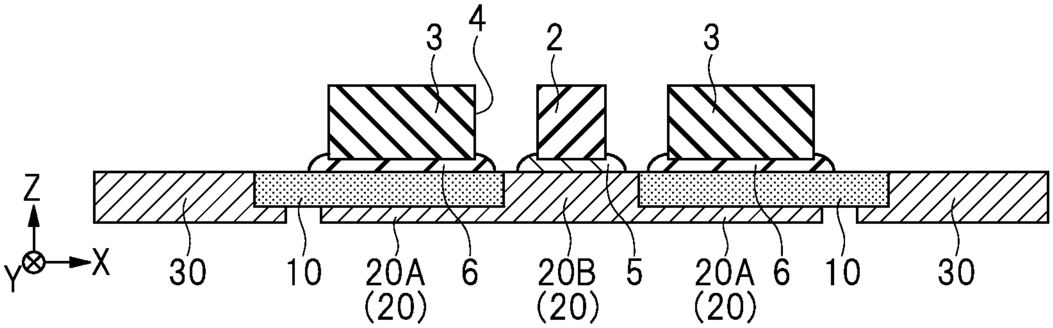
FIG. 9 is a cross-sectional view showing the method of manufacturing the semiconductor device subsequent to FIG. 8.

Next, as shown in FIG. 9, the light receiving element 3 is placed on the upper surface of the first region 20A via the resin layer 10 and the insulating adhesive layer 6 so as to be electrically insulated from the die pad 20. Then, the light emitting element 2 is placed on the upper surface of the second region 20B via the conductive adhesive layer 5 so as to be located inside the through hole 4 of the light receiving element 3. The adhesive layer 5 is made of, for example, silver paste, and the adhesive layer 6 is made of, for example, a thermosetting resin. The thickness of each of the adhesive layer 5 and the adhesive layer 6 is, for example, 10 μm or more and 20 μm or less.

Note that the order of the step of placing the light receiving element 3 and the step of placing the light emitting element 2 is not particularly limited. Further, the position of the upper surface of the light emitting element 2 is substantially on the same plane as the position of the upper surface of the light receiving element 3.

Figure 10:
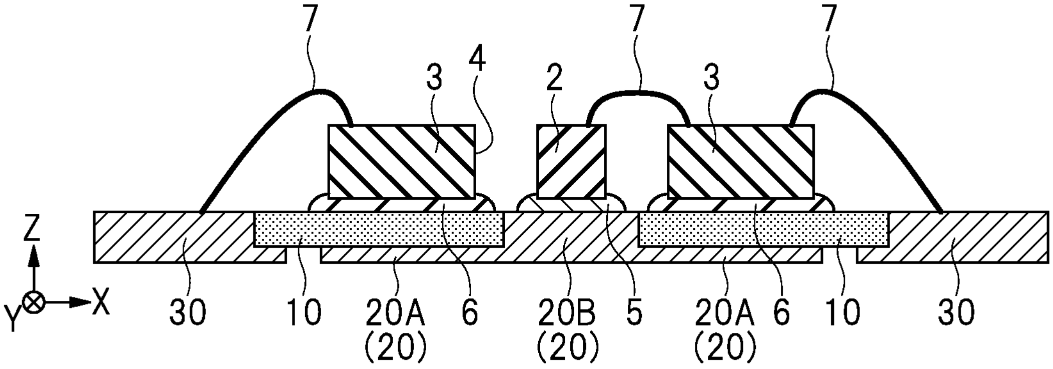
FIG. 10 is a cross-sectional view showing the method of manufacturing the semiconductor device subsequent to FIG. 9.

Next, as shown in FIG. 10, the light receiving element 3 and the plurality of lead terminals 30 are electrically connected by the bonding wires 7, and the light emitting element 2 and the light receiving element 3 are electrically connected by the bonding wire 7. Thereafter, the resin layer 11 is formed so as to seal and cover upper surfaces of the plurality of lead terminals 30, a part of the upper surface of the light receiving element 3, and the bonding wires 7, whereby the semiconductor device 1 shown in FIG. 4 is manufactured.

Main Effects of First Embodiment

In the semiconductor device 1 according to the first embodiment, since the highly difficult processing technique to form the concave portion in the light receiving element 3 like that in FIG. 1 of Patent Document 1 is not required and the semiconductor device 1 can be manufactured by the relatively easy manufacturing technique, it is possible to suppress the increase in manufacturing cost.

Also, since the light emitting element 2 and the light receiving element 3 are mounted on the upper surface of the die pad 20, mounting reliability is easily ensured as compared with a mounting form that does not use a lead frame as shown in FIG. 6 of Patent Document 1, and the reliability of the semiconductor device 1 can be improved.

Further, the position of the upper surface of the light emitting element 2 is substantially on the same plane as the position of the upper surface of the light receiving element 3. More specifically, the position of the upper surface of the light emitting element 2 and the position of the upper surface of the light receiving element 3 coincide within the range of 5 μm or less.

As described above, the light emitted from the light emitting element 2 is reflected by the object to be measured, and the reflected light is received by the light receiving element 3. Therefore, the distance from the upper surface of the light emitting element 2 (light emitting region) to the object to be measured can be made substantially equal to the distance from the object to be measured to the upper surface of the light receiving element 3 (light receiving region). Therefore, the detection accuracy of the semiconductor device 1 can be improved.

Note that the position of the upper surface of the light emitting element 2 and the position of the upper surface of the light receiving element 3 may not completely coincide depending on, for example, the formation conditions of the adhesive layer 5 and the adhesive layer 6 provided below them. However, if the positions of both upper surfaces coincide within the range of 5 μm or less, the detection accuracy of the semiconductor device 1 can be sufficiently improved.

Furthermore, depending on the formation conditions of the insulating adhesive layer 6, voids may occur inside the adhesive layer 6, and sufficient insulation may not be ensured between the light receiving element 3 and the die pad 20 in some cases. In this respect, in the first embodiment, not only the adhesive layer 6 but also the resin layer 10 is provided below the light receiving element 3. Therefore, even if the voids or the like are present, sufficient insulation can be ensured between the light receiving element 3 and the die pad 20, so that the reliability of the semiconductor device 1 can be improved.

Furthermore, depending on the formation conditions of the conductive adhesive layer 5, the adhesive layer 5 may spread too much from the light emitting element 2 and come close to the light receiving element 3 in some cases. For example, when the light emitting element 2 and the light receiving element 3 are simply arranged on the die pad 20 having a constant thickness as shown in FIG. 9 of Patent Document 1, there is the fear that the conductive adhesive layer 5 comes into contact with the side or lower surface of the light receiving element 3 and the light receiving element 3 may be short-circuited with the light emitting element 2 and the die pad 20. In order to prevent such a short circuit, it is conceivable to increase the distance between the light emitting element 2 and the light receiving element 3 (the distance between the adhesive layer 5 and the adhesive layer 6). However, in this case, the size of the semiconductor device 1 increases, so that it is not possible to promote the miniaturization of the semiconductor device 1.

In this respect, in the first embodiment, the upper surface of the resin layer 10 is flush with the upper surface of the second region 20B, and a boundary between the second region 20B and the resin layer 10 is present. Since the second region 20B and the resin layer 10 are made of different materials, the way the adhesive layer 5 spreads on the upper surface of the second region 20B is different from the way it spreads on the upper surface of the resin layer 10. Namely, even if the adhesive layer 5 spreads over the upper surface of the second region 20B, the adhesive layer 5 is hard to cross the boundary and spread over the upper surface of the resin layer 10. Therefore, it is possible to suppress the possibility that the light receiving element 3 is short-circuited with the light emitting element 2 and the die pad 20 without changing the size of the semiconductor device 1. Namely, the reliability of the semiconductor device 1 can be improved while dealing with the miniaturization of the semiconductor device 1.

Note that it is ideal that the end of the adhesive layer 5 is located on the upper surface of the second region 20B so as not to cross the boundary between the second region 20B and the resin layer 10 as shown in FIG. 4.

Second Embodiment

Figure 11:
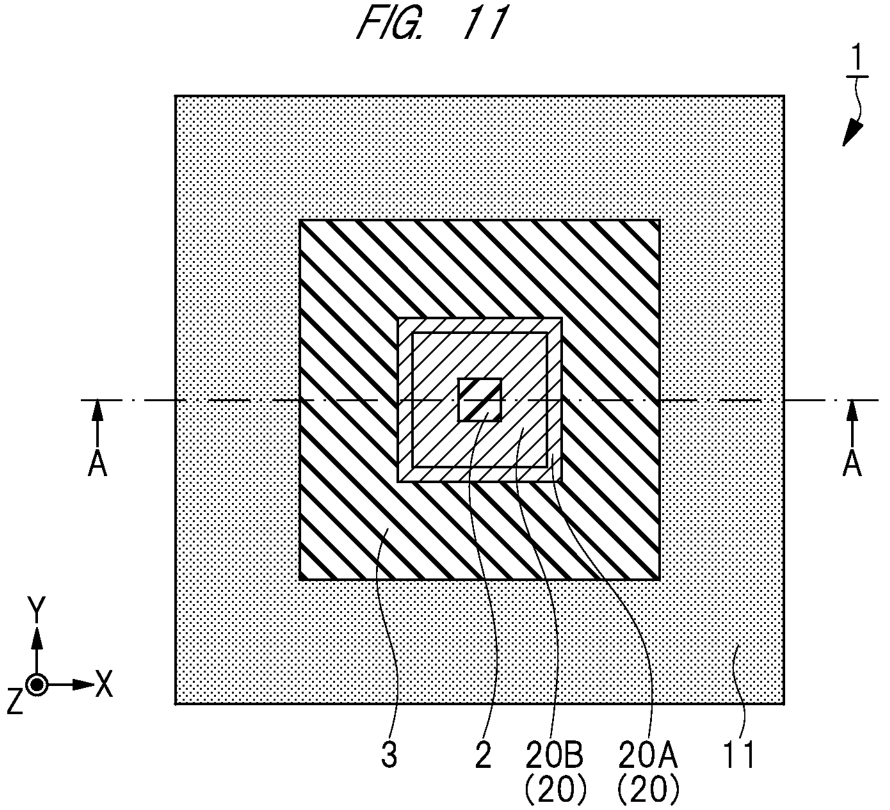
FIG. 11 is a plan view showing a semiconductor device according to the second embodiment.

A semiconductor device 1 according to the second embodiment will be described below with reference to FIG. 11 and FIG. 12. In the following description, differences from the first embodiment will be mainly described, and descriptions of the points that overlap with the first embodiment will be omitted. FIG. 11 is a plan view showing the semiconductor device 1, and FIG. 12 is a cross-sectional view taken along the line A-A shown in FIG. 11.

Figure 12:
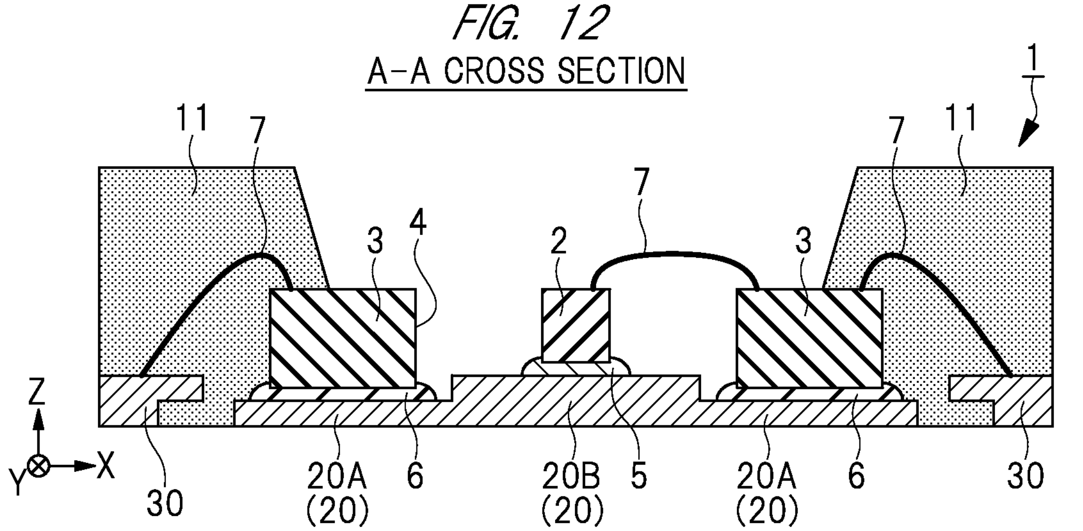
FIG. 12 is a cross-sectional view showing the semiconductor device according to the second embodiment.

As shown in FIG. 11 and FIG. 12, the second embodiment is the same as the first embodiment in that the die pad 20 includes the relatively thin first region 20A and the relatively thick second region 20B. However, in the second embodiment, the resin layer 10 is not provided on the upper surface of the first region 20A, and the adhesive layer 6 is directly provided on the upper surface of the first region 20A and the light receiving element 3 is provided on an upper surface of the adhesive layer 6.

Therefore, the first embodiment is superior to the second embodiment in terms of ensuring sufficient insulation between the light receiving element 3 and the die pad 20. However, since the manufacturing step for forming the resin layer 10 can be omitted in the second embodiment, the increase in manufacturing cost can be further suppressed as compared with the first embodiment.

In addition, since the distance from the light emitting element 2 to the light receiving element 3 (creepage distance) increases due to the step between the first region 20A and the second region 20B and the surface tension is generated at the step, the adhesive layer 5 is hard to come into contact with the side or lower surface of the light receiving element 3 even when the adhesive layer 5 spreads too much from the light emitting element 2. Therefore, since the light receiving element 3 is less likely to be short-circuited with the light emitting element 2 and the die pad 20, the reliability of the semiconductor device 1 is ensured.

Note that the height from the position of the upper surface of the first region 20A to the position of the upper surface of the second region 20B is in the range of, for example, 50% or more and 70% or less of the thickness of the metal plate 50 (thickness of the second region 20B).

<Method of Manufacturing Semiconductor Device According to Second Embodiment>

A method of manufacturing the semiconductor device 1 according to the second embodiment will be described below with reference to FIG. 13 to FIG. 18. Note that FIG. 13 to FIG. 18 are cross-sectional views taken along the line A-A like FIG. 12.

First, the metal plate 50 made of a conductive material, the light emitting element 2, and the light receiving element 3 are prepared as in the first embodiment.

Figure 13:
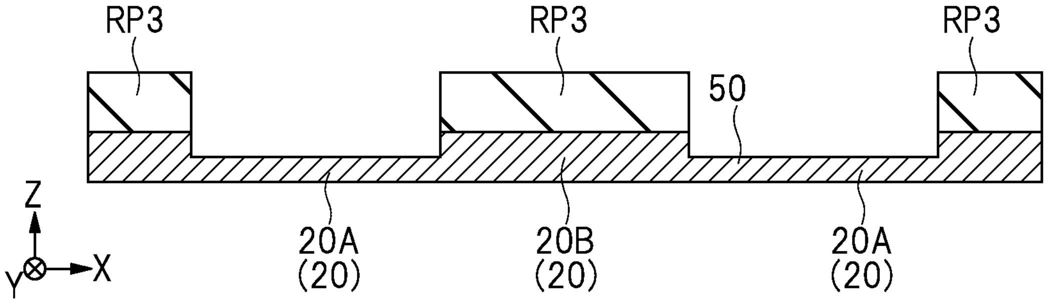
FIG. 13 is a cross-sectional view showing a method of manufacturing the semiconductor device according to the second embodiment.

Next, as shown in FIG. 13, a resist pattern RP3 is formed on the upper surface of the metal plate 50. Next, the metal plate 50 is selectively etched with the resist pattern RP3 used as a mask, thereby forming the die pad 20 including the relatively thin first region 20A and the relatively thick second region 20B. Thereafter, the resist pattern RP3 is removed.

Figure 14:
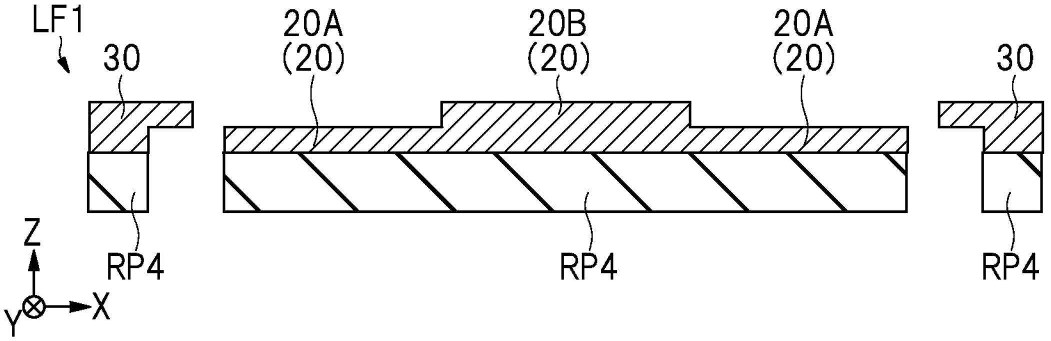
FIG. 14 is a cross-sectional view showing the method of manufacturing the semiconductor device subsequent to FIG. 13.

Next, as shown in FIG. 14, a resist pattern RP4 is formed on the lower surface of the metal plate 50. Next, by selectively etching the metal plate 50 with the resist pattern RP4 used as a mask, the lead frame LF1 in which the plurality of lead terminals 30 are arranged on the outer periphery of the die pad 20 in plan view so as to be physically separated from the die pad 20 is formed. Thereafter, the resist pattern RP4 is removed.

Figure 15:
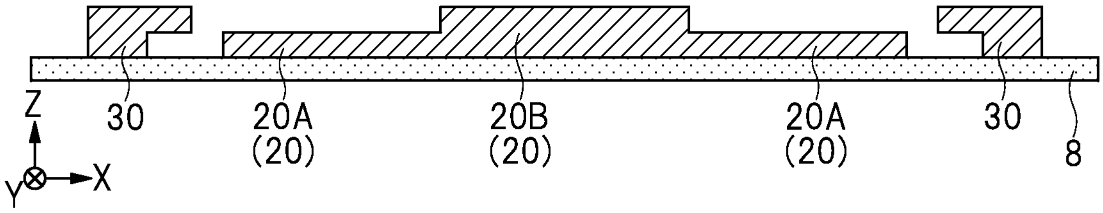
FIG. 15 is a cross-sectional view showing the method of manufacturing the semiconductor device subsequent to FIG. 14.

Next, as shown in FIG. 15, a lower surface of the die pad 20 (lower surface of the first region 20A, lower surface of the second region 20B) and lower surfaces of the plurality of lead terminals 30 are mounted on a base material 8. The base material 8 may be any material as long as it can support the mounted objects, and is, for example, an adhesive tape such as polyimide tape.

Figure 16:
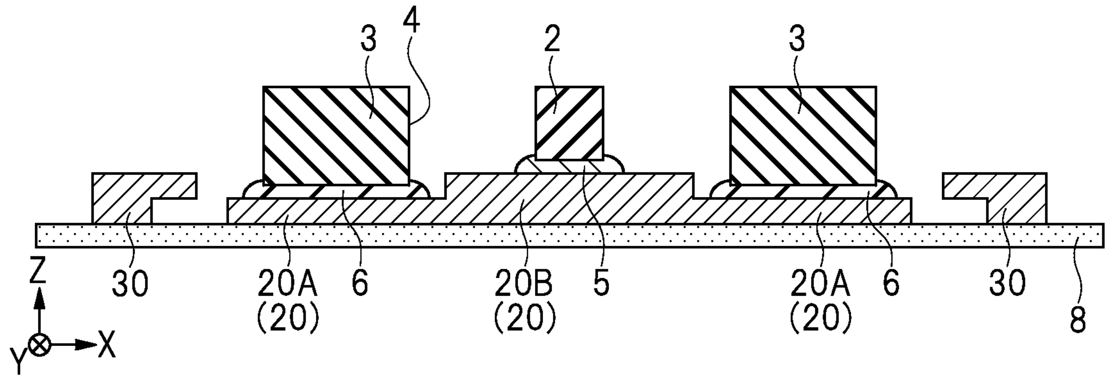
FIG. 16 is a cross-sectional view showing the method of manufacturing the semiconductor device subsequent to FIG. 15.

Next, as shown in FIG. 16, the light receiving element 3 is placed on the upper surface of the first region 20A via the insulating adhesive layer 6 so as to be electrically insulated from the die pad 20. Then, the light emitting element 2 is placed on the upper surface of the second region 20B via the conductive adhesive layer 5 so as to be located inside the through hole 4 of the light receiving element 3.

Note that the order of the step of placing the light receiving element 3 and the step of placing the light emitting element 2 is not particularly limited. Further, the position of the upper surface of the light emitting element 2 is substantially on the same plane as the position of the upper surface of the light receiving element 3.

Figure 17:
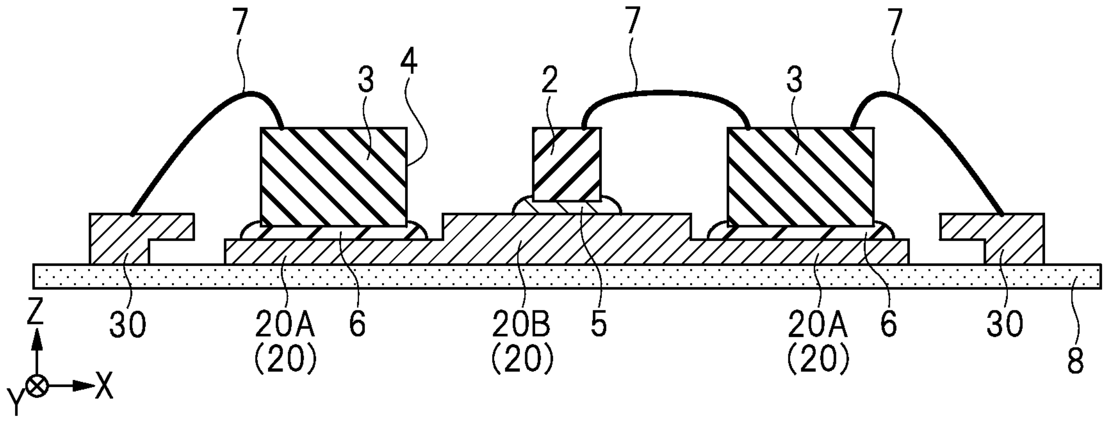
FIG. 17 is a cross-sectional view showing the method of manufacturing the semiconductor device subsequent to FIG. 16.

Next, as shown in FIG. 17, the light receiving element 3 and the plurality of lead terminals 30 are electrically connected by the bonding wires 7, and the light emitting element 2 and the light receiving element 3 are electrically connected by the bonding wire 7.

Figure 18:
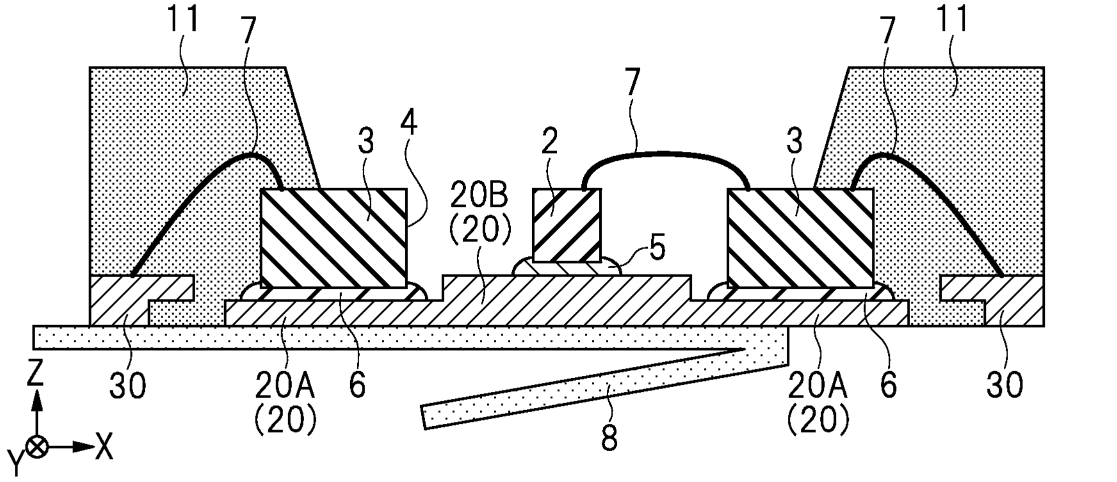
FIG. 18 is a cross-sectional view showing the method of manufacturing the semiconductor device subsequent to FIG. 17.

Next, as shown in FIG. 18, the resin layer 11 is formed so as to seal and cover the upper surfaces of the plurality of lead terminals 30, a part of the upper surface of the light receiving element 3, and the bonding wires 7. Here, the resin layer 11 is provided also between the light receiving element 3 and the plurality of lead terminals 30 and between the die pad 20 and the plurality of lead terminals 30. Next, the base material 8 is removed. Namely, when the base material 8 is an adhesive tape, the base material 8 is peeled off. Through the above steps, the semiconductor device 1 shown in FIG. 12 is manufactured.

Modification of Second Embodiment

Figure 19:
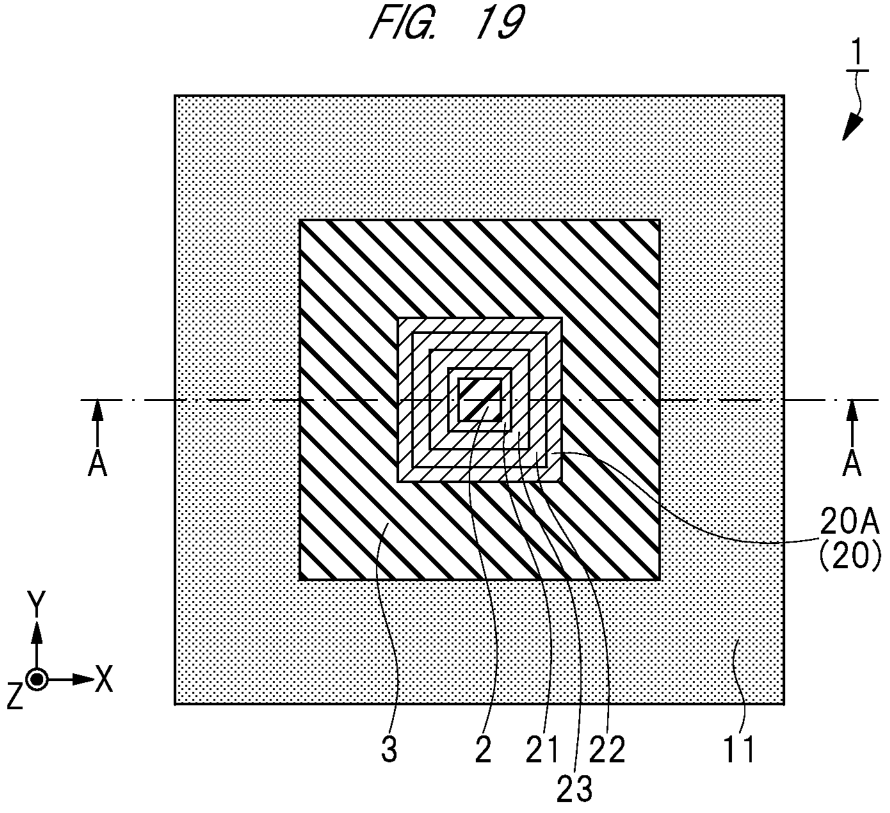
FIG. 19 is a plan view showing a semiconductor device according to a modification.

A semiconductor device 1 according to a modification of the second embodiment will be described below with reference to FIG. 19 and FIG. 20. FIG. 19 is a plan view showing the semiconductor device 1, and FIG. 20 is a cross-sectional view taken along the line A-A shown in FIG. 19.

Figure 20:
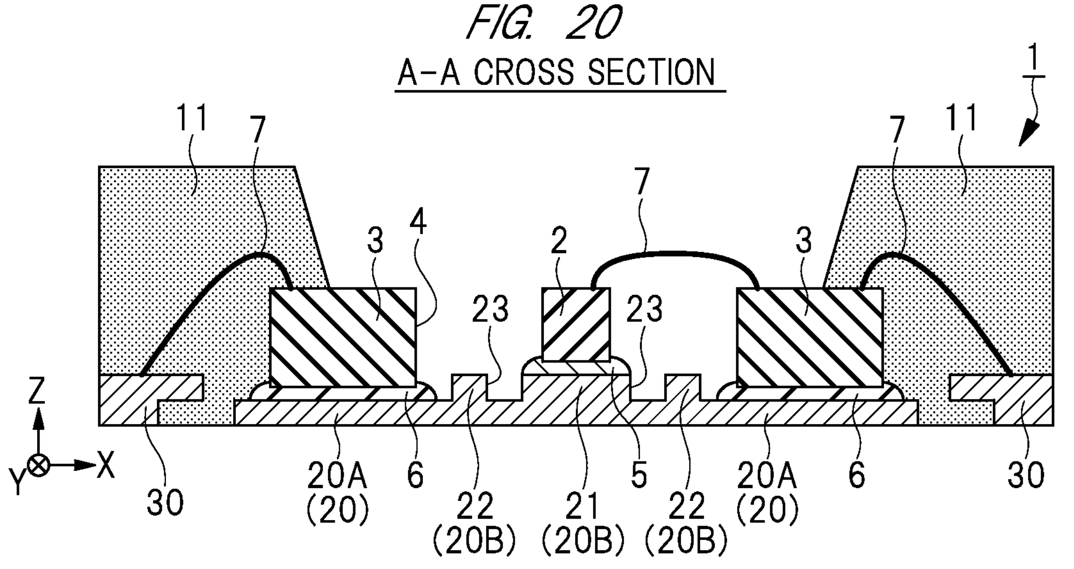
FIG. 20 is a cross-sectional view showing the semiconductor device according to the modification.

In this modification, as shown in FIG. 19 and FIG. 20, the second region 20B includes a mounting portion 21 on which the light emitting element 2 is provided, a peripheral portion 22 surrounding the mounting portion 21 in plan view, and a trench portion 23 provided between the mounting portion 21 and the peripheral portion 22. The depth of the trench portion 23 from an upper surface of the mounting portion 21 or an upper surface of the peripheral portion 22 is in the range of, for example, 50% or more and 70% or less of the thickness of the metal plate 50 (thickness of the mounting portion 21 or thickness of the peripheral portion 22).

In this modification, since the trench portion 23 is provided in the second region 20B, the distance from the light emitting element 2 to the light receiving element 3 (creepage distance) is further increased as compared with the second embodiment. Moreover, even if the adhesive layer 5 spreads, since the peripheral portion 22 serves as a wall, the adhesive layer 5 is hard to reach the light receiving element 3 beyond the peripheral portion 22. Therefore, since the adhesive layer 5 is further hard to come into contact with the side or lower surface of the light receiving element 3 and the light receiving element 3 is further less likely to be short-circuited with the light emitting element 2 and the die pad 20, the reliability of the semiconductor device 1 can be further improved.

Although the planar area of the mounting portion 21 is larger than the planar area of the light emitting element 2 here, it is sufficient if the mounting portion 21 has a size capable of stably placing the light emitting element 2. Namely, the planar area of the mounting portion 21 may be smaller than the planar area of the light emitting element 2.

Also, the mounting portion 21, the peripheral portion 22, and the trench portion 23 can be provided by changing the resist pattern RP3 in FIG. 13 to a pattern that exposes the region to be the trench portion 23 from the resist pattern RP3. Thereafter, by etching the metal plate 50 with the resist pattern RP3 used as a mask, the trench portion 23 is formed between the mounting portion 21 and the peripheral portion 22. As described above, since it is only necessary to change the mask pattern in this modification, the number of manufacturing steps is not increased as compared with the second embodiment.

Third Embodiment

Figure 21:
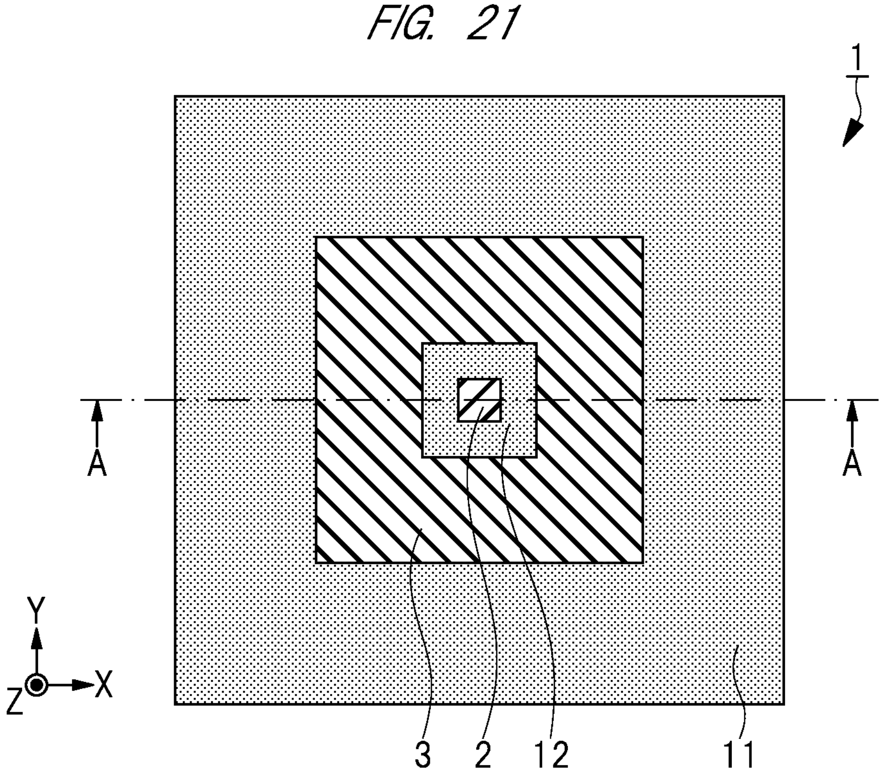
FIG. 21 is a plan view showing a semiconductor device according to the third embodiment.

A semiconductor device 1 according to the third embodiment will be described below with reference to FIG. 21 and FIG. 22. In the following description, differences from the first embodiment and the second embodiment will be mainly described, and descriptions of the points that overlap with the first embodiment and the second embodiment will be omitted. FIG. 21 is a plan view showing the semiconductor device 1, and FIG. 22 is a cross-sectional view taken along the line A-A shown in FIG. 21.

Figure 22:
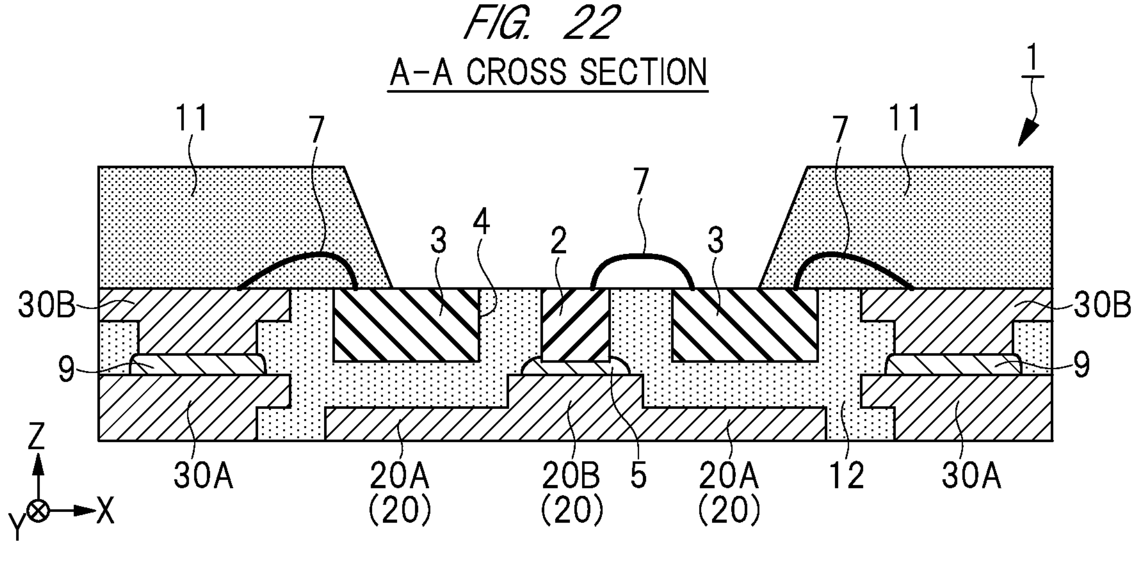
FIG. 22 is a cross-sectional view showing the semiconductor device according to the third embodiment.

As shown in FIG. 21 and FIG. 22, the third embodiment is the same as the first embodiment and the second embodiment in that the die pad 20 includes the relatively thin first region 20A and the relatively thick second region 20B.

However, in the third embodiment, the adhesive layer 6 is not provided between the light receiving element 3 and the first region 20A, and the light receiving element 3 is insulated by a resin layer 12 from the die pad 20, the light emitting element 2, the adhesive layer 5, and the plurality of lead terminals 30. In other words, the resin layer 12 is provided between the light receiving element 3 and the die pad 20, the light emitting element 2, the adhesive layer 5, and the plurality of lead terminals 30 so as to fill the through hole 4.

When the adhesive layer 6 is used, there is the fear that voids or the like are generated inside the adhesive layer 6 and sufficient insulation cannot be ensured. Therefore, by using the sufficiently thick resin layer 12, sufficient insulation is ensured between the light receiving element 3 and other structures such as the die pad 20.

In order to achieve such a structure, in the third embodiment, the thickness of each of the plurality of lead terminals 30 is increased as compared with the first embodiment and the second embodiment, and the position of the upper surface of each of the plurality of lead terminals 30 is higher than the position of the upper surface of the second region 20B. Further, as shown in FIG. 22, the upper surface of each of the plurality of lead terminals 30, the upper surface of the resin layer 12, the upper surface of the light receiving element 3, and the upper surface of the light emitting element 2 are located at substantially the same height, and are flush with each other. Therefore, in the third embodiment as well, the position of the upper surface of the light emitting element 2 and the position of the upper surface of the light receiving element 3 coincide within the range of 5 μm or less.

By increasing the thickness of each of the plurality of lead terminals 30, the thickness of the resin layer 12 can be adjusted such that the distance between the light receiving element 3 and the die pad 20 becomes longer in the manufacturing process. In the third embodiment, in order to increase the thickness of the lead terminal 30, one lead terminal 30 is formed by stacking a plurality of lead terminal members.

Here, each of the plurality of lead terminals 30 includes a first lead terminal member 30A and a second lead terminal member 30B provided on an upper surface of the first lead terminal member 30A via a conductive adhesive layer 9.

Further, since the first lead terminal member 30A and the die pad 20 are formed by processing the same metal plate 50, the thickness of the first lead terminal member 30A is the same as the thickness of the second region 20B. Therefore, the thickness of the lead terminal 30 including the first lead terminal member 30A and the second lead terminal member 30B is obviously greater than the thickness of the second region 20B.

<Method of Manufacturing Semiconductor Device According to Third Embodiment>

A method of manufacturing the semiconductor device 1 according to the third embodiment will be described below with reference to FIG. 23 to FIG. 27. Note that FIG. 23 to FIG. 27 are cross-sectional views taken along the line A-A like FIG. 22.

First, the lead frame LF1 made of a conductive material, a lead frame LF2 made of a conductive material, the light emitting element 2, and the light receiving element 3 are prepared.

Figure 23:
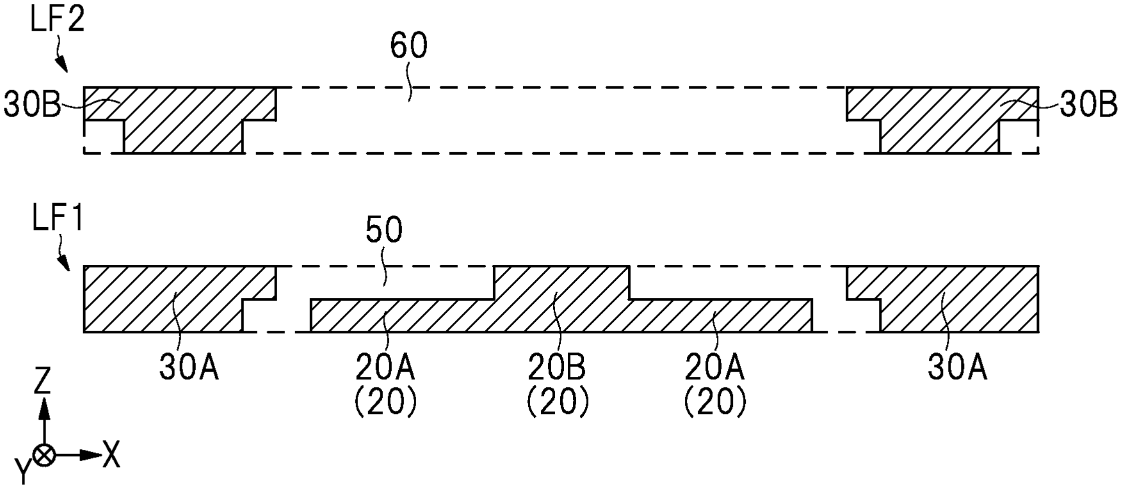
FIG. 23 is a cross-sectional view showing a method of manufacturing the semiconductor device according to the third embodiment.

The lead frame LF1 shown in FIG. 23 is formed as follows. That is, by selectively etching the metal plate 50 by the technique similar to the etching process shown in FIG. 13 and FIG. 14, the die pad 20 including the relatively thin first region 20A and the relatively thick second region 20B is formed, and the plurality of first lead terminal members 30A are formed on the outer periphery of the die pad 20 in plan view so as to be physically separated from the die pad 20.

On the other hand, by selectively etching a metal plate 60 prepared separately from the metal plate 50 by the similar technique, the lead frame LF2 composed of the plurality of second lead terminal members 30B is formed. The conductive metal used for the metal plate 60 may be the same material as that of the metal plate 50, or may be a different material from that of the metal plate 50.

Figure 24:
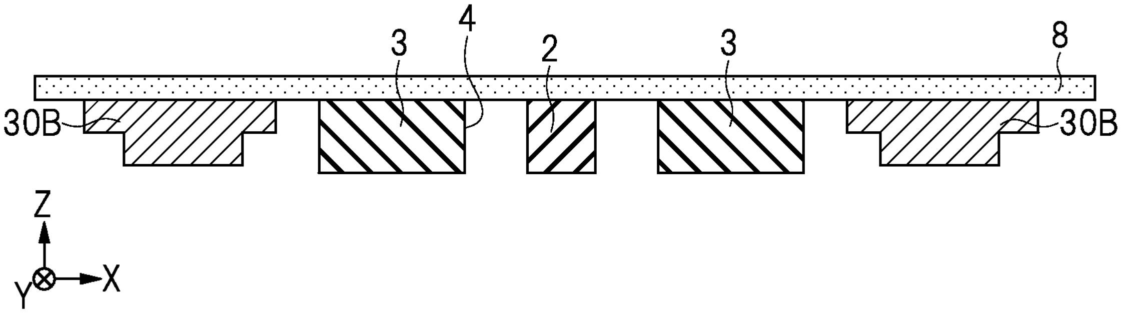
FIG. 24 is a cross-sectional view showing the method of manufacturing the semiconductor device subsequent to FIG. 23.

Next, as shown in FIG. 24, the upper surface of the light emitting element 2, the upper surface of the light receiving element 3, and upper surfaces of the second lead terminal members 30B are mounted on the base material 8 such that the light emitting element 2 is located inside the through hole 4.

Figure 25:
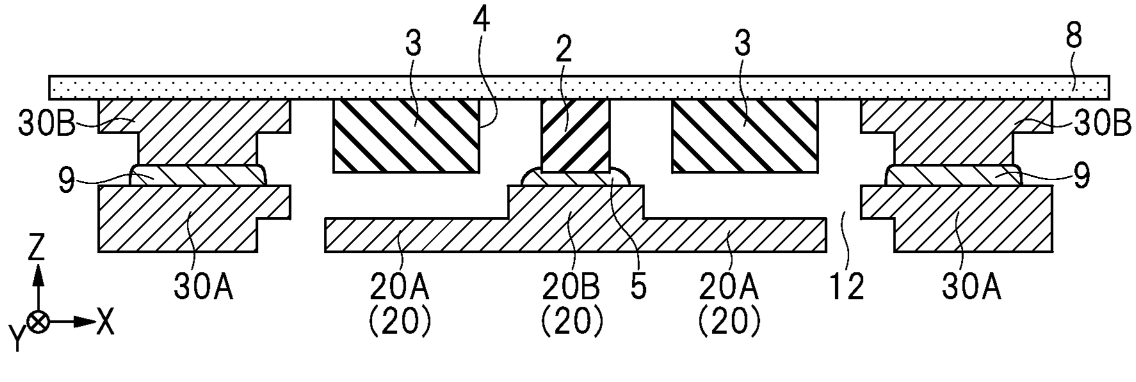
FIG. 25 is a cross-sectional view showing the method of manufacturing the semiconductor device subsequent to FIG. 24.

Next, as shown in FIG. 25, the upper surface of the second region 20B is attached to a lower surface of the light emitting element 2 via the adhesive layer 5 and the upper surfaces of the plurality of first lead terminal members 30A are attached to lower surfaces of the plurality of second lead terminal members 30B via adhesive layers 9, respectively, such that the light receiving element 3 and the first region 20A are physically separated. The adhesive layer 9 is made of, for example, silver paste.

Figure 26:
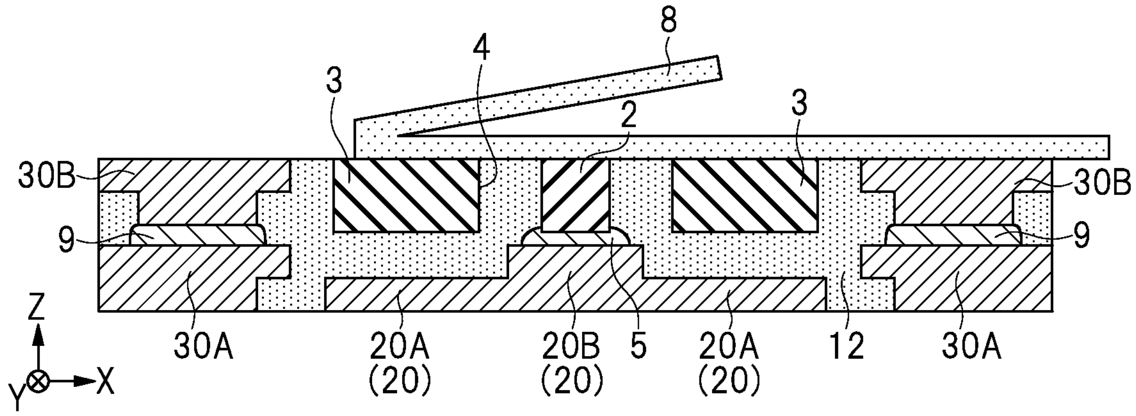
FIG. 26 is a cross-sectional view showing the method of manufacturing the semiconductor device subsequent to FIG. 25.

Next, as shown in FIG. 26, the resin layer 12 is formed so as to fill the through hole 4 and the space between the light receiving element 3 and the die pad 20, the light emitting element 2, the adhesive layer 5, the plurality of first lead terminal members 30A, and the plurality of second lead terminal members 30B. Note that the resin layer 12 is an insulating resin, for example, an epoxy resin. Next, the base material 8 is removed. Namely, when the base material 8 is an adhesive tape, the base material 8 is peeled off.

Figure 27:
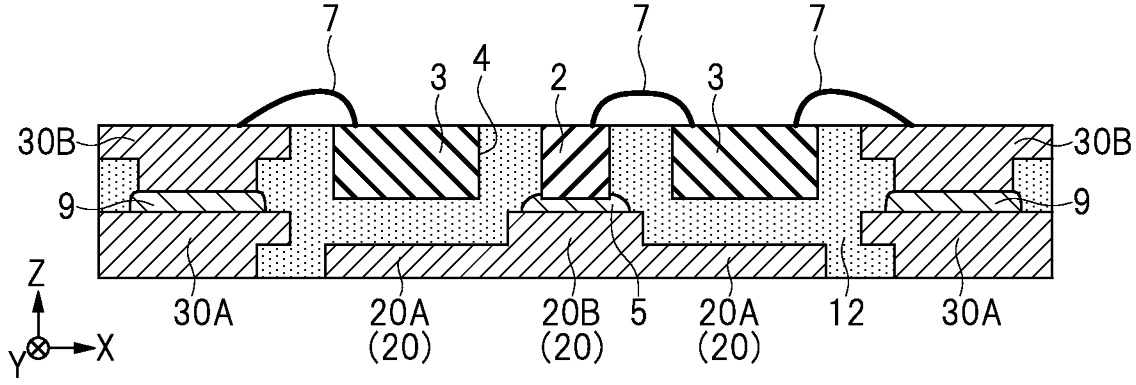
FIG. 27 is a cross-sectional view showing the method of manufacturing the semiconductor device subsequent to FIG. 26.

Next, as shown in FIG. 27, the light receiving element 3 and the plurality of lead terminals 30 are electrically connected by the bonding wires 7, and the light emitting element 2 and the light receiving element 3 are electrically connected by the bonding wire 7.

Thereafter, the resin layer 11 is formed so as to cover the upper surface of each of the plurality of lead terminals 30, a part of the upper surface of the light receiving element 3, and the bonding wires 7, whereby the semiconductor device 1 shown in FIG. 22 is manufactured.

Note that, in the third embodiment, the first lead terminal member 30A and the second lead terminal member 30B are stacked in order to increase the thickness of the lead terminal 30, but the number of stacked lead terminal members is not limited to two, and the number may be three or more. In that case, by etching the same metal plate, a lead frame (die pad) corresponding to the thickness of one lead terminal member is left also between the second region 20B and the light emitting element 2. The distance between the light receiving element 3 and the die pad 20 can be adjusted by adjusting the number of lead terminal members to be stacked.

Alternatively, by preparing one metal plate thicker than the metal plate 50 and performing the etching process plural times using a plurality of resist patterns to the one metal plate, the die pad 20 including the first region 20A and the second region 20B and the lead terminals 30 thicker than the second region 20B may be formed from one metal plate.

In the foregoing, the present invention has been specifically described based on the above embodiments. However, the present invention is not limited to the above embodiments and various modifications can be made within the range not departing from the gist thereof.

The invention claimed is:

1. A semiconductor device comprising:
a light emitting element having a light emitting region;
a light receiving element having a light receiving region; and
a die pad made of a conductive material,
wherein the die pad includes a first region and a second region having a thickness greater than that of the first region in a first direction perpendicular to an upper surface of the light emitting element or an upper surface of the light receiving element and surrounded by the first region in plan view,
wherein a through hole penetrating the light receiving element is provided in the light receiving element,
wherein the light receiving element is provided on an upper surface of the first region so as to be electrically insulated from the die pad,
wherein the light emitting element is provided on an upper surface of the second region via a conductive first adhesive layer inside the through hole, and
wherein a position of the upper surface of the light emitting element and a position of the upper surface of the light receiving element coincide within a range of 5 μm or less in the first direction.

2. The semiconductor device according to claim 1, further comprising a first resin layer provided on the upper surface of the first region such that an upper surface of the first resin layer is flush with the upper surface of the second region,
wherein the light receiving element is provided on the upper surface of the first region via the first resin layer.

3. The semiconductor device according to claim 2,
wherein an end of the first adhesive layer is located on the upper surface of the second region so as not to cross a boundary between the second region and the first resin layer in plan view.

4. The semiconductor device according to claim 1, further comprising an insulating second adhesive layer provided on the upper surface of the first region,
wherein the light receiving element is provided on the upper surface of the first region via the second adhesive layer, and
wherein a height from a position of the upper surface of the first region to a position of the upper surface of the second region is in a range of 50% or more and 70% or less of the thickness of the second region.

5. The semiconductor device according to claim 4,
wherein the second region includes a mounting portion on which the light emitting element is provided, a peripheral portion surrounding the mounting portion in plan view, and a trench portion provided between the mounting portion and the peripheral portion, and
wherein a depth of the trench portion from an upper surface of the mounting portion or an upper surface of the peripheral portion is in a range of 50% or more and 70% or less of a thickness of the mounting portion or a thickness of the peripheral portion.

6. The semiconductor device according to claim 1, further comprising:
a plurality of lead terminals provided on an outer periphery of the die pad in plan view so as to be physically separated from the die pad, and made of a conductive material; and
bonding wires electrically connecting the light receiving element and the plurality of lead terminals,
wherein a position of an upper surface of each of the plurality of lead terminals is higher than a position of the upper surface of the second region, and
wherein a second resin layer is provided between the light receiving element and the die pad, the light emitting element, the first adhesive layer, and the plurality of lead terminals so as to fill the through hole.

7. The semiconductor device according to claim 6,
wherein each of the plurality of lead terminals includes a first lead terminal member and a second lead terminal member provided on an upper surface of the first lead terminal member via a conductive third adhesive layer, and
wherein the bonding wires connect the light receiving element and the plurality of second lead terminal members.

8. The semiconductor device according to claim 7,
wherein a thickness of the first lead terminal member is the same as the thickness of the second region.

9. A method of manufacturing a semiconductor device comprising:
(a) preparing a metal plate made of a conductive material, a light emitting element having a light emitting region, and a light receiving element having a light receiving element and provided with a through hole formed therein;
(b) after the (a), selectively etching the metal plate, thereby forming a die pad including a first region and a second region having a thickness greater than that of the first region and surrounded by the first region in plan view;
(c) after the (b), selectively etching the metal plate, thereby forming a plurality of lead terminals on an outer periphery of the die pad in plan view so as to be physically separated from the die pad;
(d) after the (c), placing the light receiving element on an upper surface of the first region so as to be electrically insulated from the die pad;
(e) after the (c), placing the light emitting element via a first adhesive layer on an upper surface of the second region so as to be located inside the through hole; and
(f) after the (d) and the (e), electrically connecting the light receiving element and the plurality of lead terminals by first bonding wires and electrically connecting the light emitting element and the light receiving element by a second bonding wire,
wherein a position of an upper surface of the light emitting element and a position of an upper surface of the light receiving element coincide within a range of 5 μm or less.

10. The method of manufacturing the semiconductor device according to claim 9, further comprising
(g) between the (b) and the (c), providing a first resin layer on the upper surface of the first region such that an upper surface of the first resin layer is flush with the upper surface of the second region,
wherein, in the (d), the light receiving element is placed on the upper surface of the first region via the first resin layer.

11. The method of manufacturing the semiconductor device according to claim 10,
wherein an end of the first adhesive layer is located on the upper surface of the second region so as not to cross a boundary between the second region and the first resin layer in plan view.

12. The method of manufacturing the semiconductor device according to claim 9, wherein, in the (d), the light receiving element is provided on the upper surface of the first region via an insulating second adhesive layer, and wherein a height from a position of the upper surface of the first region to a position of the upper surface of the second region is 50% or more and 70% or less of the thickness of the second region.

13. The method of manufacturing the semiconductor device according to claim 12, wherein, in the (b), the metal plate is etched such that the second region includes a mounting portion, a peripheral portion surrounding the mounting portion in plan view, and a trench portion provided between the mounting portion and the peripheral portion, wherein a depth of the trench portion from an upper surface of the mounting portion or an upper surface of the peripheral portion is in a range of 50% or more and 70% or less of a thickness of the mounting portion or a thickness of the peripheral portion, and wherein, in the (e), the light emitting element is placed on the upper surface of the mounting portion via the first adhesive layer.

14. A method of manufacturing a semiconductor device comprising:

(a) preparing a first metal plate made of a conductive material, a second metal plate made of a conductive material, a light emitting element having a light emitting region, and a light receiving element having a light receiving region and provided with a through hole provided therein;

(b) after the (a), selectively etching the first metal plate, thereby forming a die pad including a first region and a second region having a thickness greater than that of the first region and surrounded by the first region in plan view and forming a plurality of first lead terminal members on an outer periphery of the die pad in plan view so as to be physically separated from the die pad;

(c) after the (a), selectively etching the second metal plate, thereby forming a plurality of second lead terminal members;

(d) after the (b) and the (c), mounting an upper surface of the light emitting element, an upper surface of the light receiving element, and upper surfaces of the plurality of second lead terminal members on a base material such that the light emitting element is located inside the through hole;

(e) after the (d), attaching an upper surface of the second region to a lower surface of the light emitting element via a conductive first adhesive layer and attaching upper surfaces of the plurality of first lead terminal members to lower surfaces of the plurality of second lead terminal members via conductive third adhesive layers, respectively, such that the light receiving element and the first region are physically separated;

(f) after the (e), providing a resin layer between the light receiving element and the die pad, the light emitting element, the first adhesive layer, the plurality of first lead terminal members, and the plurality of second lead terminal members so as to fill the through hole;

(g) after the (f), removing the base material; and (h) after the (g), electrically connecting the light receiving element and the plurality of second lead terminal members by first bonding wires and electrically connecting the light emitting element and the light receiving element by a second bonding wire, wherein a position of the upper surface of the light emitting element and a position of the upper surface of the light receiving element coincide within a range of 5 μm or less.

15. The method of manufacturing the semiconductor device according to claim 14, wherein a thickness of the first lead terminal member is the same as the thickness of the second region.

* * * * *